United States Patent [19]

Crabb et al.

[11] Patent Number: 5,092,728
[45] Date of Patent: Mar. 3, 1992

[54] SUBSTRATE LOADING APPARATUS FOR A CVD PROCESS

[75] Inventors: Richard Crabb, Mesa; McDonald Robinson, Paradise Valley; Mark R. Hawkins, Mesa; Dennis L. Goodwin, Tempe; Armand P. Ferro, Scottsdale, all of Ariz.; Wiebe B. deBoer, Eersel, Netherlands; Albert E. Ozias, Aumsville, Oreg.

[73] Assignee: Epsilon Technology, Inc., Tempe, Ariz.

[21] Appl. No.: 315,332

[22] Filed: Feb. 24, 1989

Related U.S. Application Data

[62] Division of Ser. No. 108,771, Oct. 15, 1987, Pat. No. 4,828,224.

[51] Int. Cl.$^5$ .............................................. F16K 1/16
[52] U.S. Cl. ........................... 414/217; 414/225; 414/416; 414/331; 414/744.2; 118/719; 204/298.25; 901/40
[58] Field of Search .............. 414/222, 217, 416, 417, 414/331, 225, 786, 744.2; 118/730, 719, 50, 50.1; 204/298.25; 251/298, 303, 326; 901/40

[56] References Cited

U.S. PATENT DOCUMENTS

| | | | |
|---|---|---|---|
| 4,293,249 | 10/1981 | Whelan | 414/217 X |
| 4,405,435 | 9/1983 | Tateishi et al. | 414/217 X |
| 4,553,069 | 11/1985 | Purser | 414/225 X |
| 4,664,578 | 5/1987 | Kakehi | 414/217 |
| 4,687,542 | 8/1987 | Davis et al. | 414/217 X |
| 4,746,256 | 5/1988 | Boyle et al. | 414/217 |
| 4,764,076 | 8/1988 | Layman et al. | 414/217 |
| 4,775,281 | 10/1988 | Prentakis | 414/217 X |
| 4,781,511 | 11/1988 | Harada et al. | 414/217 |
| 4,789,294 | 12/1988 | Sato et al. | 414/225 X |
| 4,815,912 | 3/1989 | Maney et al. | 414/217 |

FOREIGN PATENT DOCUMENTS 8704414  7/1987  PCT Int'l Appl. ................. 414/217

Primary Examiner—Frank E. Werner
Attorney, Agent, or Firm—Cahill, Sutton & Thomas

[57] ABSTRACT

Each substrate is loaded into a receiving chamber upon a positionable platform, which platform is in sealed relationship with the receiving chamber to permit purging of the receiving chamber prior to transport of the loaded substrate(s) to a feed chamber. The platform is positioned from the receiving chamber into the feed chamber wherefrom the substrates are off loaded. A cassette containing a plurality of stacked substrates may be loaded upon the platform to transport a plurality of substrates into the feed chamber.

7 Claims, 7 Drawing Sheets

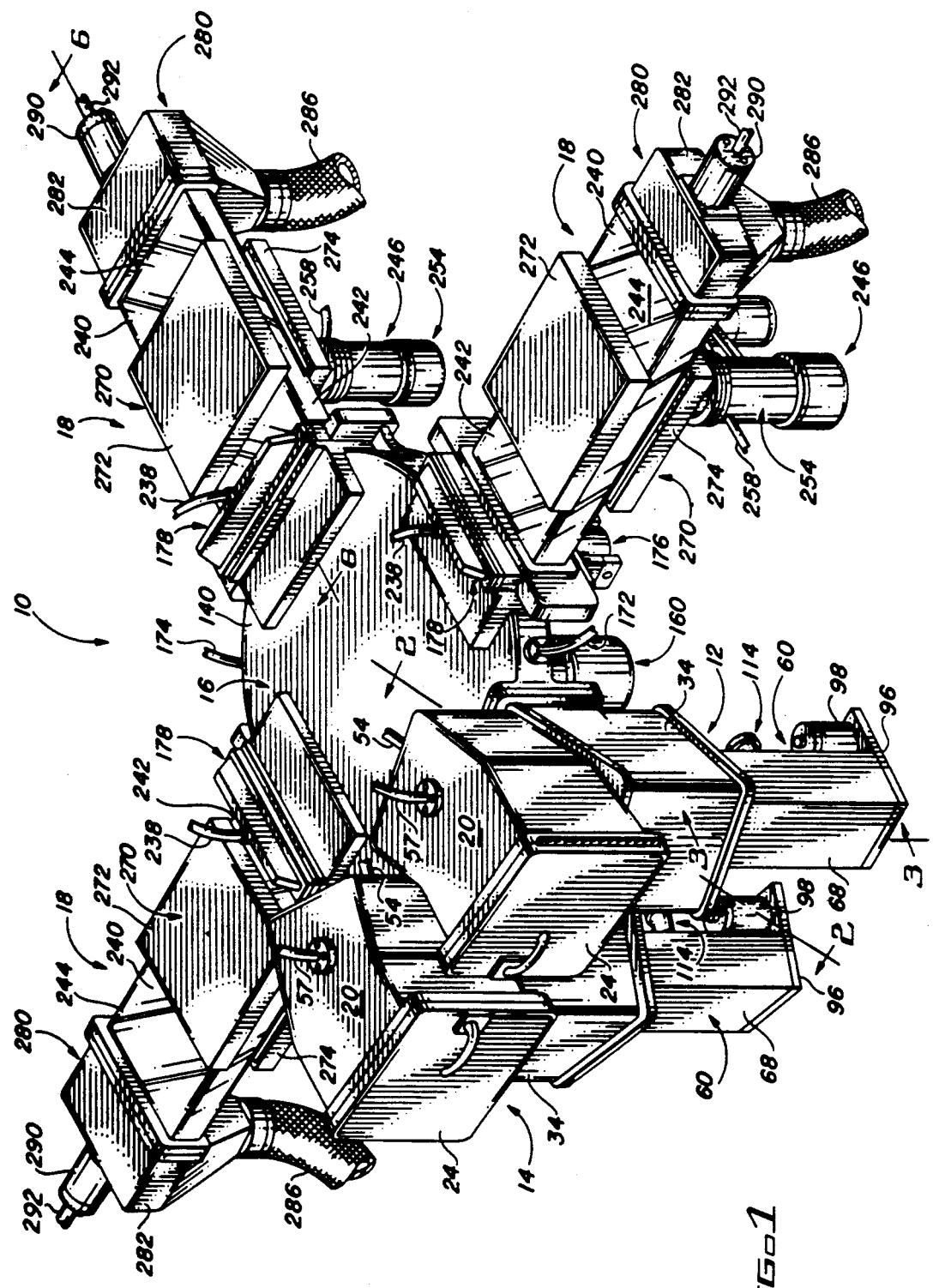

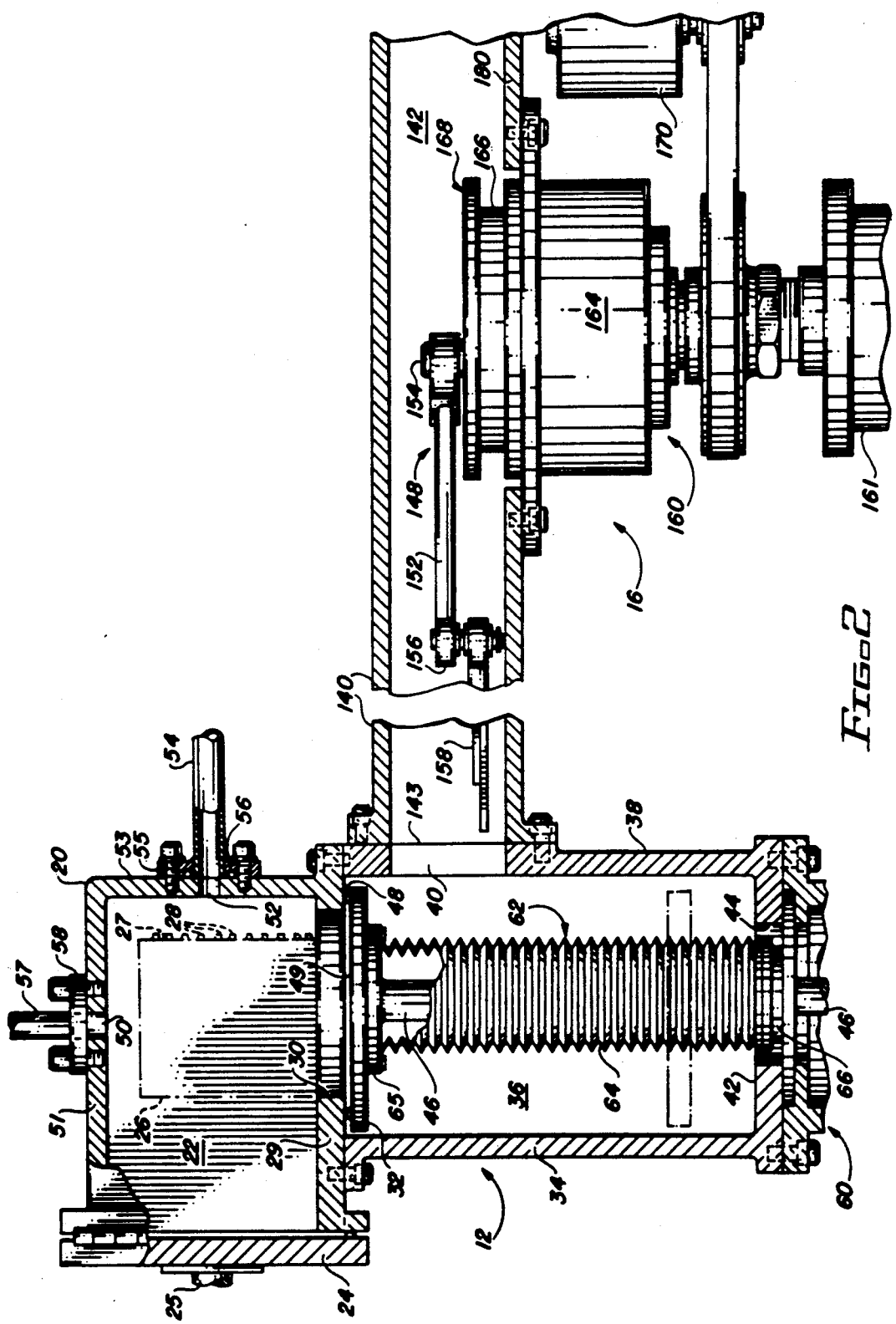

SUBSTRATE LOADING APPARATUS FOR A CVD PROCESS

This is a division of application Ser. No. 108,771, filed Oct. 15, 1987, now U.S. Pat. No. 4,828,224.

BACKGROUND OF THE INVENTION

1. Field of the Invention

This invention relates to substrate chemical vapor deposition apparatus and, more particularly, to substrate loading, off loading and handling subsystems interacting with a processing subsystem.

2. Discussion of the Related Art

In the electronics art, it has long been a practice to employ chemical vapor deposition techniques for depositing various materials on substrates or wafers as part of the process for manufacturing semiconductor devices. Chemical vapor deposition processes include passing of a reactant gas, which contains the material to be deposited, over the substrates for forming or growing a compound on the substrates through thermal reaction or decomposition of the various gaseous materials.

The equipment used to accomplish such a process may be of various configurations but will include the basic components of a reaction chamber, a heating system and a gas flow system. Batch processing equipment has been used to accomplish the chemical vapor deposition process in a production environment; it may be a horizontal gas flow system or a vertical gas flow system. A horizontal gas flow system includes a susceptor located in a horizontally disposed reaction chamber with the reactant gas flowing in a horizontal path across the susceptor. In a vertical gas flow system, a horizontally disposed susceptor, or an upstanding multisurface barrel shaped susceptor, is located in a vertically disposed reaction chamber with the reactant gas flowing in a substantially vertical path past and around the susceptor. In either system, the susceptors are configured to support a multiplicity of relatively small substrates, i.e. in the neighborhood of 2 to 5 inches (5 to 12.5 cm) in diameter. While simultaneous deposition of materials on a multiplicity of substrates is desirable from a manufacturing standpoint, it has some drawbacks from a quality standpoint.

The first problem associated with batch processing relates to the reactant gas. As the gas flows over the surfaces of the substrates and the susceptor, deposition of the materials results in changes in the concentration of the materials in the reactant gas. Consequently, as the reactant gas flows across or over the length of these relatively large susceptors, across each individual substrate and across a multiplicity of such substrates, different rates of growth of the deposited layer of material may occur. A second problem is that of temperature control, which is critical at the elevated temperature needed for proper deposition. It is difficult, if not impossible, to control the temperature within the critical tolerances at all locations of interest within relatively large reaction chambers. This results in different deposition layer thicknesses from substrate to substrate and can result in a varying thickness on an individual substrate. Contamination is a third problem which can result from various factors, such as handling techniques in loading and unloading the substrates, introduction of the reactant gas into the reaction chamber, and the like.

These problems all contribute to significant difficulties as the uses of the semiconductor devices developed from the substrates become more sophisticated. To alleviate some problems, manufacturers are now using automated loading and off loading devices instead of manual techniques. In vertical gas flow systems, the upstanding barrel shaped structure is rotated about its vertical axis to rotate the multiplicity of substrates within the reaction chamber. Such rotation produces temperature and reactant gas flow averaging. However, there are practical limits which many believe will ultimately make the batch processing techniques unacceptable or at least undesirable. One of the limitations is that the equipment is not very well suited for handling larger diameter substrates. Increasing the size of the substrate causes some problems with regard to temperature differentials across the substrate, decreasing concentrations of the deposition material across the substrate, and the like. Single substrate chemical vapor deposition equipment becomes inherently more desirable than multisubstrate equipment as the manufacturers change to larger substrates, i.e. 6 to 8 inches (15 to 20 cm) in diameter or larger. One important consideration is the cost at risk when processing one substrate as opposed to simultaneous multisubstrate processing; that is, if something goes wrong, the monetary loss is far less with one substrate than it is with a plurality of substrates.

Various prior art components and subsystems have been used in single substrate processing chemical vapor deposition systems. For example, loading and unloading of substrates into such systems may be handled in various ways with the most pertinent prior art structure being a cassette elevator. The cassette elevator includes a vacuum chamber for receiving a plurality of substrates that are carried in a cassette supported on a platform. The platform is vertically movable by an elevating mechanism to bring the substrates one at a time into alignment with an access port. An isolation valve is located at the access port for closing the vacuum chamber except during extraction of the individual substrates. Both the elevating mechanism and the isolation valve provide a controllable environment for receiving and loading the substrates.

A vacuum transport station extracts the substrates one at a time from the elevating mechanism and includes a housing coupled to the isolation valve. A robot arm structure, located in the housing, includes a rotatable plate having extensible and retractable arms with a pallet or spatula at the distal end. With the plate and arms rotated into alignment with the access port and the isolation valve open, the arms are extended to move the pallet into position below a substrate. The arms are raised to lift the substrate on the pallet and out of the cassette, retracted to extract the substrate from the elevating mechanism, rotated to another position and extended once to pass though another isolation valve into a reaction chamber. This handling system relies on the weight of the substrate to hold it in place on the pallet; another prior art structure includes a similar arm arrangement with a vacuum outlet in the pallet for a more positive attachment to the underside of the substrate.

The operation of the above described loading system can be reversed for extracting a processed substrate from the reaction chamber and returning it to the same cassette or to another cassette in a second elevating mechanism for off loading of processed substrates.

While the above describe loading, handling and off loading structures are significantly better than manual operations, they are less than completely satisfactory.

One of the prime considerations in modern chemical vapor deposition systems is to minimize contamination or prevent it entirely. Because the vacuum chamber must be opened from time to time for insertion and extraction of cassettes, environmental contamination will occur. The isolation valve prevents contaminants from passing through the vacuum chamber of the elevating mechanism into the housing of the transport system during the time when the vacuum chamber is open to the environment.

A significant problem lies with the robot arm structure. First, such a substrate handling technique cannot possibly place a substrate on a flat continuous surface due to the pallet supporting the bottom surface of the substrate. Therefore, some sort of less than ideal susceptor configuration must be provided in the reaction chamber. Second, damage often results from the mechanical contact of the pallet with the substrate. Contaminants in the form of airborne particles, which may result from the damage or other sources, can settle on the top surface of the substrate, which reduces the yield of the substrates and destroys circuit integrity.

The reaction chambers used in single substrate processing systems may be either a horizontal gas flow system or a vertical gas flow system. The susceptors presently used therein essentially consist of a planar platform and contribute nothing to improve the problems of depletion of the material carried by the reactant gas as it flows past and around the substrate or to improved temperature sensing and control.

SUMMARY OF THE INVENTION

The chemical vapor deposition system includes a substrate loading subsystem for receiving cassettes carrying multiple substrates to be processed and an identical off loading subsystem for receiving processed substrates in cassettes. The loading and off loading subsystems include an isolation valve which closes off the rest of the system from environment contamination whenever the loading and unloading subsystems are open for insertion or for removal of the cassettes. A substrate handling subsystem operates in accordance with Bernoulli's principle for moving the substrates within the system without any mechanical contact with the top or the bottom surfaces of the substrates. The housing of the substrate handling subsystem includes one or more delivery ports through which substrates are supplied to and retrieved from a processing subsystem coupled to the delivery ports. An isolation valve assembly having a ported gate valve is mounted proximate each delivery port of the housing for closing the delivery port whenever a chemical vapor deposition cycle is underway in the processing subsystem. A gas injection structure is interposed between the isolation valve assembly and the inlet of the processing subsystem to provide a reactant gas flow of special profile through the reaction chamber. The processing subsystem includes a reaction chamber configured to provide a desirable gas flow characteristic for accomplishing the deposition process in a precisely controllable environment. The reaction chamber housing includes a substrate supporting susceptor and a temperature averaging and reactant gas flow averaging subsystem. A drive shaft assembly depending from the susceptor is rotatably driveable to rotate the susceptor and the supported substrate. A master temperature sensor is located in the vicinity of the center of the susceptor and a fixed ring concentric with the susceptor includes a plurality of slave temperature sensors. The master and slave temperature sensors produce signals indicative of the temperatures sensed and the signals are transmitted to a temperature control means. A heating system includes an upper radiant heat assembly disposed atop the reaction chamber for directing radiant heat downwardly into the chamber and a lower radiant heat assembly located below the reaction chamber for directing heat upwardly into the chamber. A heat concentrator structure directs concentrated radiant heat into the vicinity of the center of the susceptor. The upper and lower heating structures have individually controllable banks of discrete heating elements for heating various regions in and about the susceptor. A purging subsystem controls the gas flow within the system and maintains a contaminant free environment therein.

Accordingly, it is an object of the present invention to provide a chemical vapor deposition system for continuous and sequential handling and processing of single substrates.

Another object of the present invention is to provide a substrate loading and unloading subsystem for inserting cassettes containing multiple substrates into the system to process the substrates and for retrieving cassettes loaded with the processed substrates from the system to substantially reduce contamination resulting from the insertion and retrieval of the cassettes.

Another object of the present invention is to provide a new and improved chemical vapor deposition system having a substrate handling system which moves the substrates within the system without physical contact with the top and bottom surfaces of the substrates.

Another object of the present invention is to provide a substrate handling subsystem for moving individual substrates from a loading subsystem into a desired one of a plurality of processing subsystems, for retrieving the substrates and for delivering the processed substrates to an unloading subsystem.

Another object of the present invention is to provide ported gate valves for isolating a substrate handling subsystem from a processing subsystem at all times except when substrates are being inserted into or retrieved from the processing subsystem.

Another object of the present invention is to provide gas injectors for inducing a predetermined flow profile of the reactant gas supplied to a processing subsystem.

Another object of the present invention is to provide a gas flow profile through a reaction chamber having a susceptor and a heat sensing subsystem.

Another object of the present invention is to provide a rotating substrate to optimize averaging of the temperature differences and the material concentration differences in the reactant gas.

Another object of the present invention is to provide a temperature sensing apparatus for sensing the temperatures in and about a rotatable susceptor and to produce signals for controlling the heat input to various regions in and about a susceptor.

Another object of the present invention is to provide a heating subsystem controllable to direct variable amounts of radiant heat energy into a reaction chamber to optimize heating in the various regions in and about a rotatable susceptor.

Another object of the present invention is to provide a purging subsystem for maintaining a contaminant free environment within a chemical vapor deposition system.

Still another object of the present invention is to provide a built in isolation valve to prevent environmental contamination of a chemical vapor deposition system.

Yet another object of the present invention is to provide an isolation valve between various subsystems of a chemical vapor deposition system to selectively isolate the subsystems.

The foregoing and other objects of the present invention will be more fully understood from the following description when read in conjunction with the accompanying drawings.

BRIEF DESCRIPTION OF THE DRAWINGS

FIG. 1 is a perspective view of a chemical vapor deposition system;

FIG. 2 is a sectional view taken along lines 2—2 shown in FIG. 1;

DESCRIPTION OF THE PREFERRED EMBODIMENTS

Figure 8:
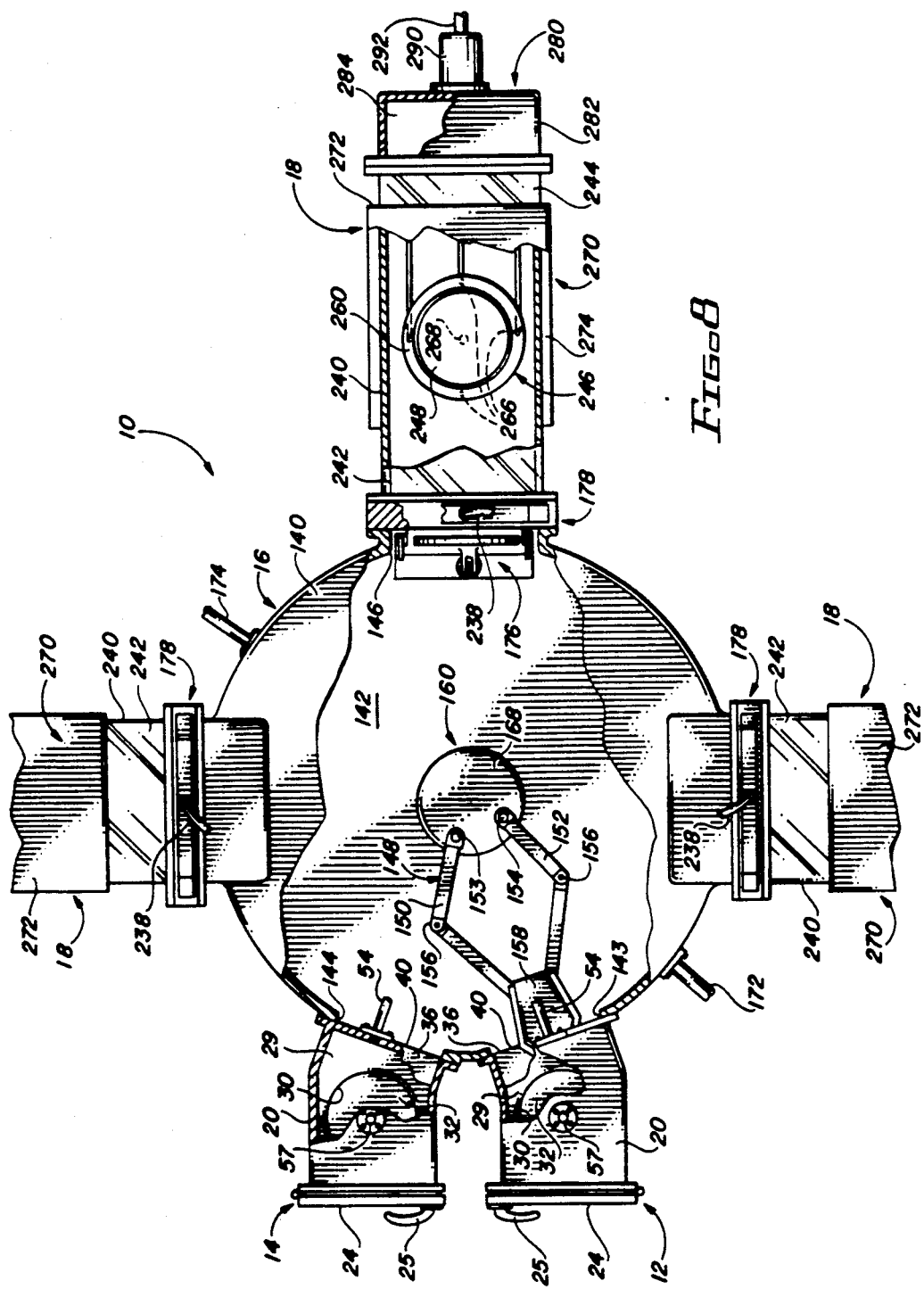
FIG. 8 is a plan view showing various relationships and features of the subsystems.

Referring to FIGS. 1 and 8, chemical vapor deposition system 10 is formed of several subsystems, including a substrate loading subsystem 12, an identical substrate unloading subsystem 14 and a substrate handling subsystem 16. Three identical processing subsystems 18 are shown. Deposition system 10 is completely operational with a single processing subsystem; additional processing subsystems would be employed for reasons of production rate.

Loading and unloading subsystems 12 and 14 respectively, are identical but operated in a different way; it will be understood that the following detailed description will apply to each. Referring to FIGS. 1, 2, 3, 4 and 5, loading subsystem 12 includes an upper housing 20 which defines a hermetically sealable cassette receiving chamber 22. The upper housing has a hatch 24 hingedly mounted on upper housing 20 with a suitable latch 25 for opening the hatch to permit a cassette 26 to be placed in and retrieved from the receiving chamber. The cassette is a case like structure having an open side 27 and a plurality of shelf like supports (not shown) for containing and providing lateral access to a plurality of vertically spaced stacked substrates 28. The upper housing includes a plate or floor 29 having a large central opening 30, which opening is closed by a cassette support platform 32 when a cassette is being loaded into or unloaded from receiving chamber 22.

Loading subsystem 12 includes an intermediate housing 34 bolted or otherwise attached to be immediately below upper housing 20; it defines a feed chamber 36. Intermediate housing 34 is open at the top whereby floor 29 forms the top wall of the intermediate housing and opening 30 in floor 29 open into feed chamber 36. The intermediate housing includes a sidewall 38 having a lateral feed port 40 and a bottom wall 42 provided with a central opening 44 in axial alignment with central opening 30.

Cassette support platform 32 is mounted on the upper end of an elevator shaft 46 for vertical movement between an elevated position, shown in solid lines in FIG. 2, and a fully lowered position, shown in phantom lines. The support platform has seal means 48, such as an 0 ring, extending upwardly from top surface 49. When the support platform 32 is fully elevated, seal means 48 engages the lower surface of floor 29 about opening 30 to hermetically seal receiving chamber 22 from feed chamber 36. Floor 29, opening 30 and the cassette support platform cooperate to provide loading subsystem 12 with a built in isolation valve that isolates feed chamber 36 from receiving chamber 22. Such isolation keeps out environmental contamination from feed chamber 36 whenever hatch 24 is open for loading or retrieval of a cassette. Because environmental contamination will enter receiving chamber 22 during loading and unloading operations, upper housing 20 is provided with a purge gas inlet port 50 in its top wall 51 and a purge gas outlet port 52 in one of its sidewalls 53. As shown in FIG. 2, the purge gas outlet port is coupled to a suitable gas disposal location (not shown) by an exhaust tube 54 fixedly attached to a mounting plate 55 bolted to upper housing 20 with a suitable O ring seal 56. The purge gas inlet port is similarly coupled to a remote source of pressurized purge gas (not shown) by a supply tube 57 with a mounting plate 58.

An elevator means 60 is mounted below intermediate housing 34 and elevator shaft 46 extends from the elevator means axially through opening 44 in bottom wall 42 of the intermediate housing. The top end of the elevator shaft is axially disposed in a bellows seal assembly 62. The bellows seal assembly includes an axially extensible bellows 64 having an upper mounting plate 65 attached to the lower surface of cassette support platform 32 and a lower mounting plate 66 attached to the bottom wall of intermediate housing 34. In this manner, feed chamber 36 is isolated from the elevator means and contamination is prevented from entering the feed chamber from the elevator means.

Elevator means 60, attached to depend from intermediate housing 34, includes an elongated housing 68 defining an internal chamber 70. An elongated guide rail 72 is mounted within the elevator housing with a pair of tracks 74 formed on opposed longitudinal edges. An elevator carriage 76 is mounted on the guide rail. The elevator carriage includes a housing 78 with wheels 79 for engaging tracks 74. Elevator shaft 46 is fixed in a bore 80 by set screws 81. The elevator shaft defines an axial bore 82 having an open lower end. An elongated lead screw 84 is journaled in a bearing assembly 86 mounted in bottom wall 87 of elevator housing 68 to locate the lead screw with lower end 88 depending axially from housing 68 and upper threaded end 90 extending axially upwardly into bore 82 of elevator shaft 46. A follower nut 92 is bolted to the lower end of carriage housing 78 and internally threaded bore 94 is in threaded engagement with lead screw 84.

A plate 96, mounted on the lower surface of the bottom wall of elevator housing 68 includes a laterally extending portion 97 upon which a drive motor 98 is mounted. The drive motor is an electrically and reversibly operated digital stepping motor and has drive pulley 100 mounted on output shaft 102. A drive belt 104 couples the drive pulley with a driven pulley 106 mounted on lower end 88 of the lead screw.

When drive motor 98 is operated, the lead screw 84 will rotate about its longitudinal axis with the follower nut to move elevator carriage 76 along guide rail 72, either upwardly or downwardly, as determined by the direction of rotation. When the elevator carriage is in its lowered position, as shown in FIG. 3, cassette support platform 32 is in its lowered position; the elevator carriage is movable upwardly to raise the cassette support platform to its upper position.

Figure 3:
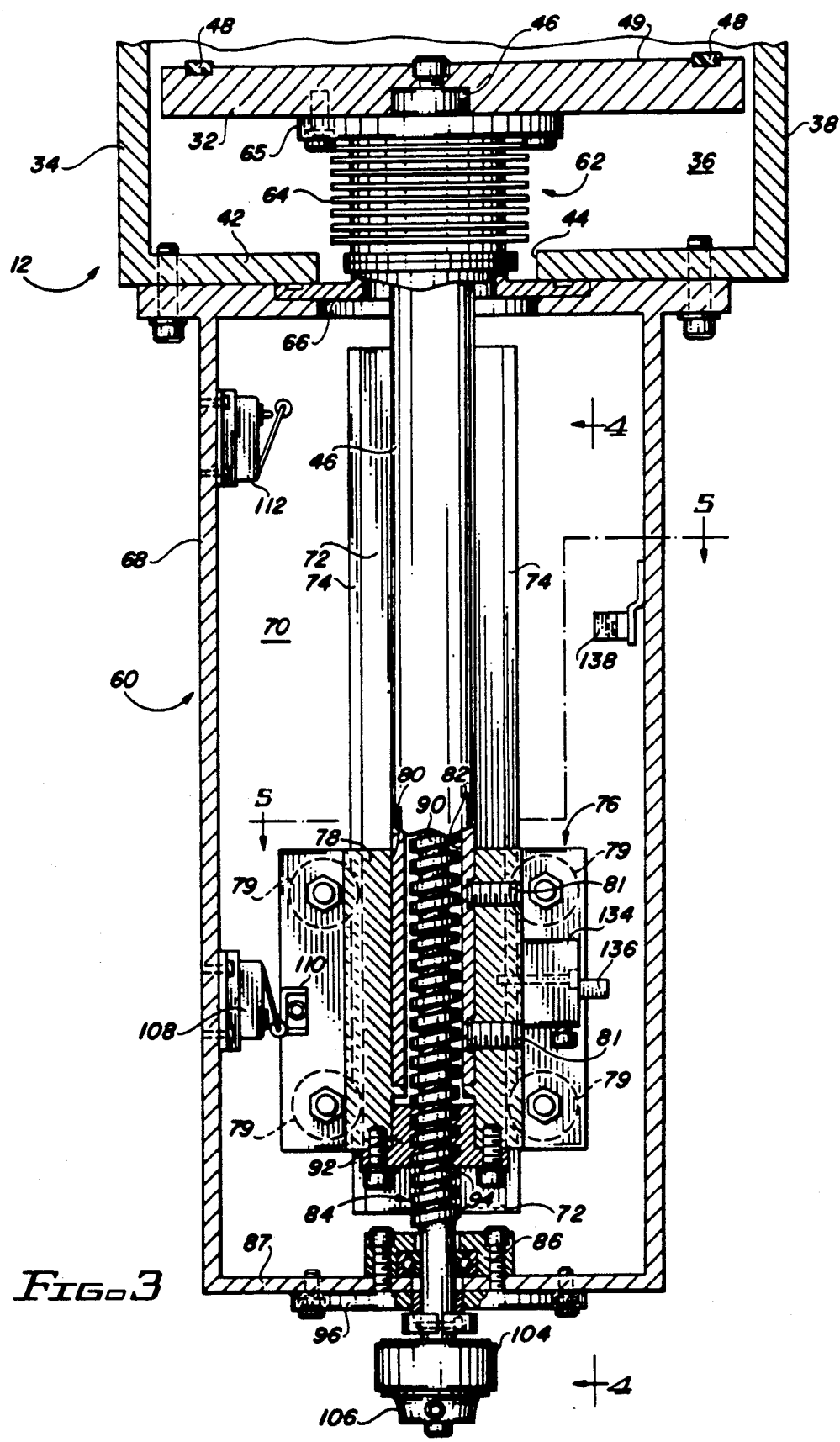
FIG. 3 is a sectional view taken along lines 3—3 shown in FIG. 1.
Figure 5:
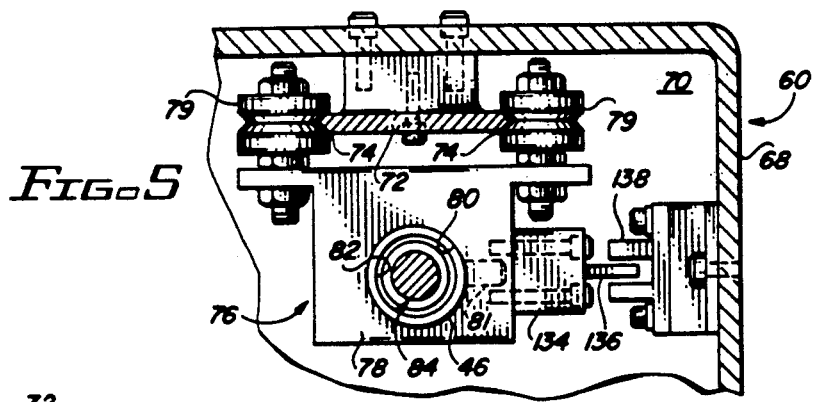
FIG. 5 is a sectional view taken along lines 5—5 shown in FIG. 3.
Figure 4:
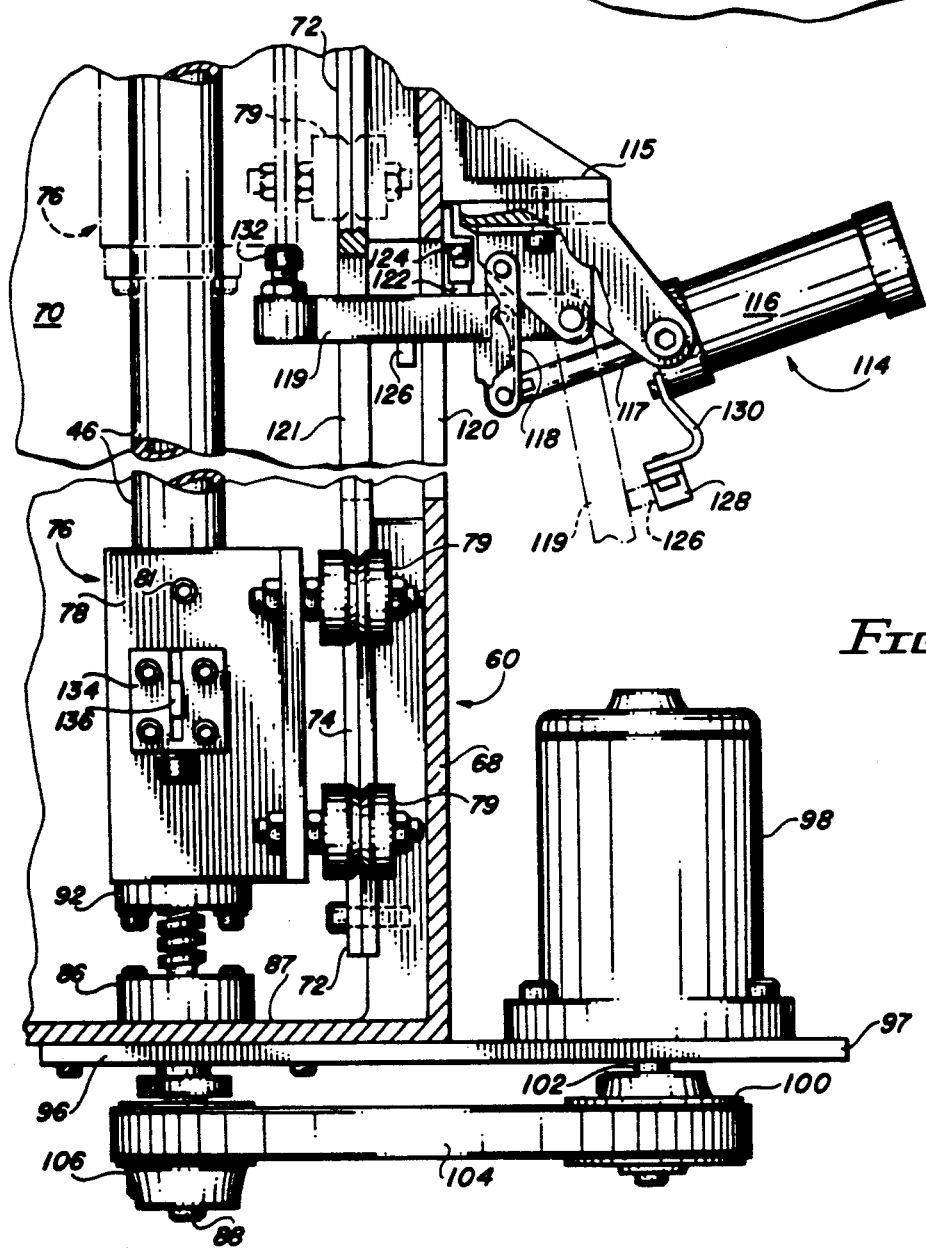
FIG. 4 is a sectional view taken along lines 4—4 shown in FIG. 3.

As shown in FIG. 3, a lower limit switch 108 is mounted in elevator housing 68 for engaging switch actuator arm 110 mounted on carriage housing 78. The lower limit switch is used as a emergency stopping device which prevents the elevator carriage from moving below a lower limit. An upper limit switch 112 is mounted in the elevator housing for engaging switch actuator arm 110 when the elevator carriage reaches its upper position. In addition to limiting the upward movement of the elevator carriage, the upper limit switch produces a signal indicative of the up position of substrate support platform 32; the signal is used by suitable control means (not shown) to actuate a latching mechanism 114, shown in FIG. 4. The latching mechanism is bolted to a mounting bracket 115 on the exterior of elevator housing 68. The latching mechanism includes a pneumatic (or hydraulic) cylinder 116 having a reciprocally extensible rod 117 that operates an over center linkage 118 for moving a clamping arm 119 back and forth through an opening 120 formed in housing 68 and an aligned opening 121 formed through guide rail 72. The clamping arm is movable from a carriage latching position, shown in solid lines in FIG. 4, to a carriage releasing position, shown in dashed lines. The clamping arm includes a first indicator lug 122 which interacts with a first detector switch 124, such as an optical sensor, to produce a control signal indicative of the latched position of the clamping arm. Clamping arm 119 includes a second indicator lug 126, for interacting with a second detector switch 128 mounted on cylinder 116 with a bracket 130 to provide a control signal indicative of the unlatched position of the clamping arm. Latching mechanism 114 is operable to clamp and hold cassette support platform 32 in sealed engagement with floor 29 of upper housing 20 by engagement of an adjustable bolt 132 mounted on the distal end of the clamping arm with the lower end of the carriage, as shown in FIG. 4. By virtue of over center linkage 118, latching mechanism 114 will maintain the latched position of clamping arm 119 despite power failures, equipment shut down and the like, to prevent system contamination during such periods and during normal operation. As shown in FIG. 3 and 5, another position indicator is provided in elevator means 60 that includes a mounting assembly 134 having a lug 136 and a sensor device 138, such as an optical sensor, mounted to interact with lug 138 and produce a control signal indicative of alignment of lowermost substrate 28 in cassette 26 with feed port 40 of intermediate housing 34.

When as cassette 26 containing substrates 28 has been loaded into receiving chamber 22 of upper housing 20 after the chamber has been purged, latching mechanism 114 is operated to move clamping arm 119 to its unlatched position. Thereafter, drive motor 98 is operated in a stepped manner to lower elevator carriage 76 and support platform 32. When lug 136 is aligned with sensor device 138, a resulting control signal is supplied to a control system (not shown) which sequentially lowers support platform 32 and cassette 26 to sequentially move the substrates into the desired position relative to feed port 40 of intermediate housing 34.

Loading subsystem 12 is mounted on handling subsystem 16 operated to extract the substrates from the loading subsystem for sequential processing. Unloading subsystem 14 is similarly mounted on handling subsystem 16 for receiving the processed substrates. Unloading subsystem 14, identical to loading subsystem 12, is operated in a reverse manner to unload the processed substrates.

With reference to FIGS. 1, 2 and 8, handling subsystem 16 includes a housing 140 defining an internal chamber 142. The housing includes a substrate input port 143 aligned with feed port 40 of loading subsystem 12 and an output port 144 aligned with feed port 40 of unloading subsystem 14. Housing 140 is also provided with at least one delivery port 146 for passing substrates into processing subsystem(s) 18. Transport of the substrates from the loading subsystem into the processing subsystem and movement of processed substrates from the processing subsystem into the unloading subsystem is accomplished by wafer handling mechanism 148, which includes a pair of articulated robot arms 150 an 152 having proximal ends mounted to be rotated about drive shafts 153 and 154, respectively, of a robot arm drive assembly 160. Each of the arms 150 and 152 also has an intermediate joint 156; a pick up wand 158 is mounted at the distal ends of the arms. Drive shafts 153 and 154 are rotated in opposite directions for extending and retracting the robot arms. The drive assembly, shown in FIG. 2, includes a first drive motor 161 which rotates a center shaft (not shown) extending upwardly from the first drive motor through the center of a coaxial bearing and seal mechanism 164 to drive the internal gears (not shown) of a gear box 166 associated with drive shafts 153 and 154. A second drive motor 170 rotates a tubular shaft (not shown) concentrically disposed about the center shaft. The tubular shaft extends through bearing and seal mechanism 164 to rotate entire gear head 168. The gear head is rotatable to selectively position robot arms 150 and 152 in alignment with the various ports of housing 140. When in any of these aligned positions, drive assembly 160 is operated to extend and retract the robot arms to move pick up wand 158 to locations for picking up and delivering substrates 28.

Pick up wand 158 operates in accordance with the Bernoulli principle to produce an area of relatively low pressure between the downwardly facing surface of the pick up wand and the top surface of the substrate to be moved. In this manner, the pick up wand can lift and move a substrate without ever touching the top or bottom planar surfaces of the substrate. The only physical contact between the pick up wand and a substrate is an edge contact made to cause the substrate to move with the pick up wand. Pick up wand 158 has an array of gas outlets (not shown) coupled to a remote source of gas under pressure (not shown). The connection of the wand to the remote source of gas is made via passages formed through robot arms 150 and 152 and drive assembly 160.

In addition to the gas which enters housing 140 of handling subsystem 16 from pickup wand 158, the housing has a purge gas inlet 172 and a purge gas outlet 174.

Figure 6:
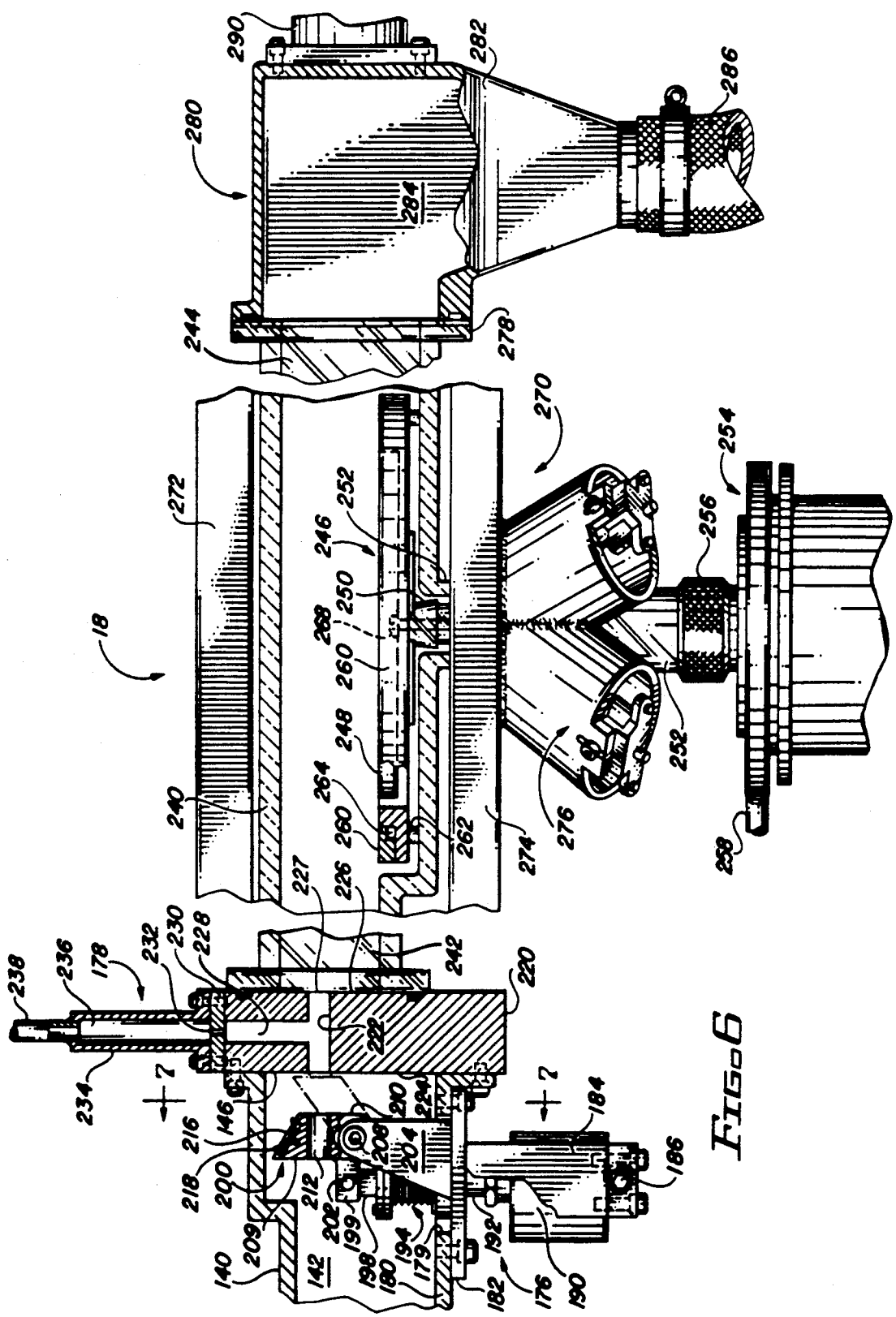
FIG. 6 is a sectional view taken along lines 6—6 shown in FIG. 1.

Handling subsystem 16 moves the substrates to be processed through an isolation valve 176 and a gas injector 178 into processing subsystem 18, as shown in FIG. 6. It also retrieves the processed substrates through the gas injector and the isolation valve when processing is complete.

Figure 7:
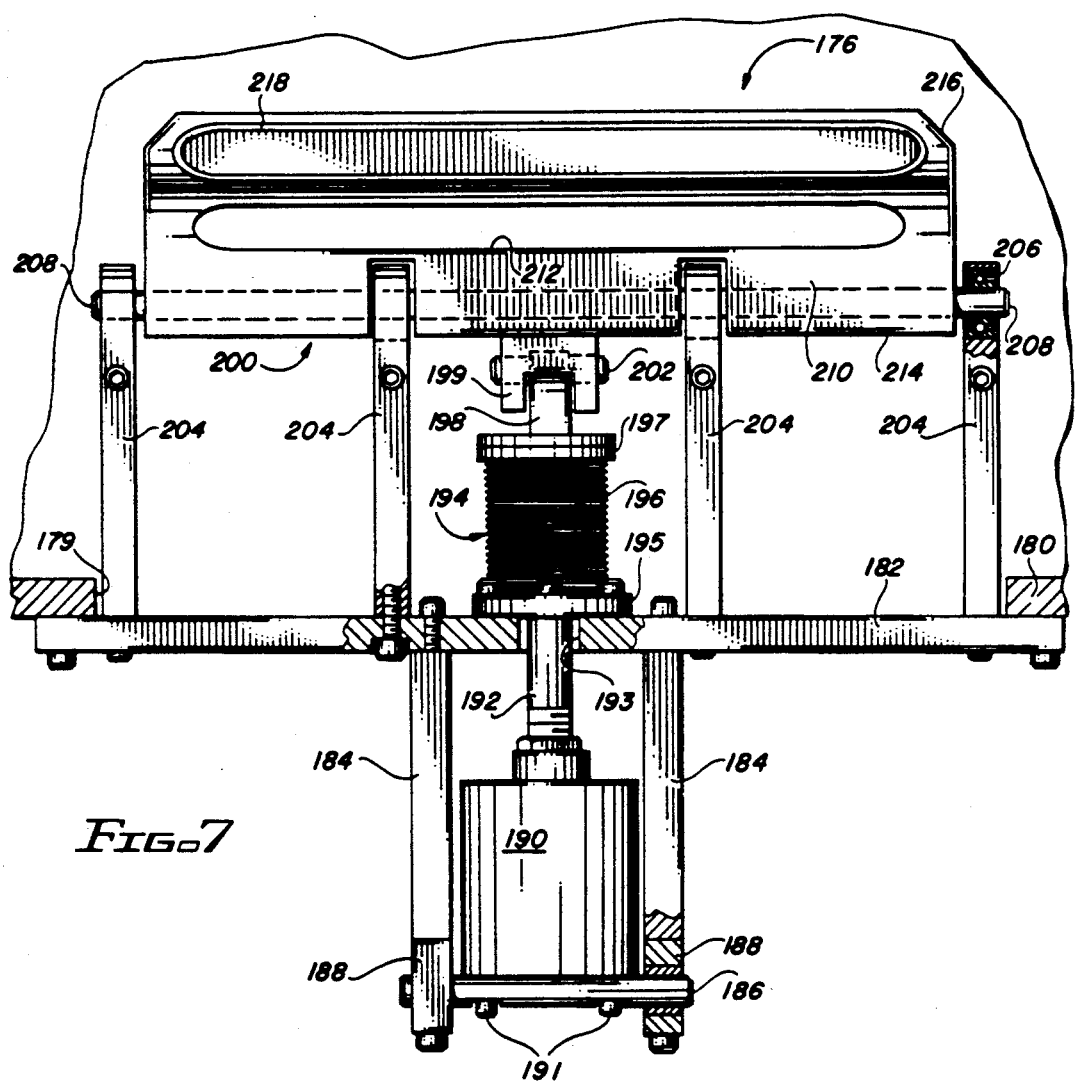
FIG. 7 is a sectional view taken along lines 7—7 shown in FIG. 6.

Housing 140 of handling subsystem 16, as shown in FIG. 6 and 7, includes an opening 179 in bottom surface 180 adjacent delivery port 146. Isolation valve 176 is mounted in opening 179 within housing 140 proximate delivery port 146. The isolation valve includes a mounting plate 182 bolted or otherwise attached to the bottom surface of the housing to hermetically seal opening 179 and support the various components of the isolation valve. A pair of actuator support arms 184 depend from mounting plate 182 in spaced apart relationship with respect to each and a rock shaft 186 is transversely journaled in bushing blocks 188 mounted at the lower ends of the actuator support arms. A pneumatic actuator 190 is mounted with cap screws 191 to rock shaft 186. Reciprocally extensible rod 192 of actuator 190 extends upwardly through an opening 193 formed in mounting plate 182. A bellows seal 194 is concentrically disposed about the extensible rod to hermetically seal opening 193 through which the extensible rod extends. The bellows seal has a lower mounting flange 195 sealingly attached to the upper surface of mounting plate 182 about opening 193 and an extensible bellows 196 that extends upwardly about actuator rod 192. An upper mounting flange 197 of the bellows seal is attached to the actuator rod proximate upper end 198, which upper end is connected to a clevis 199 of a valve body 200 by a pivot pin 202.

A plurality (four shown) of valve body support arms 204 are mounted to extend upwardly from mounting plate 182 in spaced apart relationship. Bearings 206 (one shown) are mounted in the top end of each of the support arms for journaling a pivot shaft 208 mounted in valve body 200. The valve body is of elongated configuration with opposed planar surfaces 209 and 210 and an elongated open port 212 extending transversely through the body to the opposed planar surfaces. Pivot shaft 208 extends longitudinally through the valve body proximate side edge 214 with the opposite longitudinal side edge forming a valve closing surface 216. As shown best in FIG. 6, the valve closing surface forms an acute angle of 30°–40° with respect to open port 212. An O ring sealing gasket 218 is provided on the valve closing surface.

When actuator 190 is in the retracted state, valve body 200 will be in the position shown by a solid line in FIG. 6, which position is referred to as the open position of isolation valve 176. When in the open position, open port 212 will be in a parallel relationship with mounting plate 182 and the distal ends of robot arms 150 and 152 and pick up wand 158 (with any substrates carried thereby) can be transported through open port 212. When actuator 190 is operated to move extensible rod 192 to its extended state, valve body 200 will be pivoted through less than 90° of rotation to the closed position, shown in dashed lines in FIG. 6, and valve closing surface 216 will be brought into seated sealing engagement with gas injector 178.

Gas injector 178, as shown best in FIG. 6, includes an elongated injector housing 220 interposed between substrate delivery port 146 of handling subsystem housing 140 and the input to processing subsystem 18. The injector housing includes an elongated through port 222 extending transversely between opposite planar surfaces 224 and 226 of the injector housing. Isolation valve 176 is operable to selectively open and close through port 222 of the injector housing with ga outlet side 227 of the through port remaining open to the processing subsystem at all times. The valve closing surface 216 of valve body 200 of isolation valve 176 is movable into sealing engagement with surface 224 of injector housing 220 to close the end of the through port which faces into housing 140 of handling subsystem 16.

Injector housing 220 includes a gas flow passage 228 normal to the through port and extending upwardly therefrom to the top edge surface of the injector housing. An elongated flow control plate 230 having a plurality of variously sized apertures 232 (one shown) formed in spaced increments along its length, is mounted on the top edge of injector housing 220 to align apertures 232 with gas flow passage 228 of the housing. A gas inlet body 234 is mounted atop flow control plate 230 and is configured to define a plenum chamber 236 having a bottom opening to the upper surface of the flow control plate. A gas inlet conduit 238 is mounted on the top end of the inlet body to supply gas under pressure from a remote source (not shown) to the plenum chamber. The plenum chamber distributes the gas pressure equally to all points in the chamber to apply equal gas pressures to the open top end of each of apertures 232. The gas will flow into gas flow passage 228 at various velocities as determined by the apertures in flow control flange 230. The gas passes downwardly into through port 222 with a predetermined velocity profile through gas outlet side 227 and into processing subsystem 18.

A single one of the processing subsystems 18 may be coupled to handling subsystem 16 to form a complete chemical vapor deposition system 10. However, the system may be expanded to include a plurality of processing subsystems 18, if desired. Each of the processing subsystems 18 is preferably identical. The processing subsystem, as best shown in FIGS. 6 and 7, includes a reaction chamber 240. The reaction chamber is a horizontal flow low profile housing designed to produce a desired gas flow characteristic from its inlet end 242 to its outlet end 244. The reaction chamber is formed of a material which is transparent to radiant heat energy, such as quartz, and works in conjunction with a substrate supporting susceptor and a temperature sensing subsystem 246.

The substrate supporting and temperature sensing subsystem 246 includes a circular susceptor 248 configured to support a single substrate for rotation about an axis normal to the center of the substrate. The susceptor is mounted in reaction chamber 240 on the upper end of a drive shaft assembly 250 which extends from the susceptor through a tubular shaft 252 depending from the floor of the reaction chamber, as shown in FIG. 6. The drive shaft assembly is coupled to a drive means 254 which rotates the drive shaft and the susceptor. The tubular shaft is sealingly coupled by collar 256 to the drive means. A purge gas inlet conduit 258 supplies purge gas from a remote source of gas under pressure (not shown). The purge gas is directed into drive means 254 and is supplied though tubular shaft 252 of the reaction chamber and drive shaft assembly 250 to enter the reaction chamber below the susceptor. The susceptor, and therefore the substrate supported thereon, are rotated for temperature averaging purposes and for averaging the thickness of the deposition layer resulting from the passage of reactant gas across the substrate.

A fixed, nonrotating ring 260 is supported in concentric relationship with the susceptor on a stand means 262 (see FIG. 6). A plurality of temperature sensors 266 (FIG. 8) are mounted at various points in annular chamber 264 for sensing the temperatures at these points. Temperatures sensors 266 interact with a central temperature sensor 268 disposed at the upper end of drive shaft assembly 250 and proximate the center of the susceptor to produce control signals for operating a heating subsystem 270.

The heating subsystem includes an upper radiant heat assembly 272, disposed in overlaying relationship with respect to reaction chamber 240, for directing radiant heat energy downwardly onto the rotating susceptor, temperature sensing ring 260 and adjacent areas. A lower heat assembly 274 is disposed in underlying relationship with respect to the reaction chamber for directing radiant heat energy upwardly into the reaction chamber and onto susceptor 248, ring 260 and adjacent areas. Heating subsystem 270 also includes a heat concentrator structure 276 which is employed to direct concentrated radiant heat energy upwardly into the vicinity of the center of the susceptor for temperature control purposes. Upper and lower heat assemblies 272 and 274 have individually controllable banks of discrete heating elements (not shown) for heating the various regions on and about susceptor 248, temperature ring 260 and those banks of elements in conjunction with concentrator structure 276, which concentrator structure is separately controlled to provide optimum temperature controlling capability.

Outlet end 244 of reaction chamber 240 has a suitable flange 278 formed thereon and a spent gas collector means 280 is coupled with the flange. The gas collector means includes a housing 282 defining a collection chamber 284 into which spent reactant gas, purge gas and the like are received after passing through reaction chamber 240. The spent gas is directed via a hose 286 to a disposal location (not shown). A suitable motor 290, such as pneumatic, is mounted on housing 282 and has a linearly extensible output shaft 292 (see FIGS. 1 and 8) for extending engagement with any fixed structural means (not shown). When operated to extend the shaft 292, the entire gas collector means 280 reacts by moving toward reaction chamber 240 to load its inlet end 242 into sealed engagement with the gas injector structure 178 and to load housing 282 into sealed engagement with outlet end 244 of the reaction chamber.

While the principles of the invention have now been made clear in an illustrative embodiment, there will be immediately obvious to those skilled in the art many modifications of structure, arrangement, proportions, elements, materials and component used in the practice of the invention which are particularly adapted for specific environments and operating requirement without departing from those principles.

What we claim is:

1. A mechanism for moving at least one workpiece from a first environment, which first environment is cyclicly in communication with the ambient atmosphere and segregated from the ambient atmosphere into a second environment, which second environment is continuously sealed from the ambient atmosphere, and return while preventing cross-contamination between the two environments, said mechanism comprising:
   a) a receiving chamber defining the first environment, said receiving chamber including a hatch openable to the ambient atmosphere for placing at least one workpiece in said receiving chamber;
   b) a feed chamber disposed underneath said receiving chamber, said feed chamber being open to the second environment;
   c) said receiving chamber including a floor for separating said receiving chamber from said feed chamber, said floor including an opening formed therethrough;
   d) a movable support platform for supporting the workpiece placed within said receiving chamber, said support platform having an elevated position for engaging said floor to hermetically seal said opening and a lowered position disposed within said feed chamber, said support platform being disposed to receive the workpiece upon placement thereof in said receiving chamber;
   e) elevator means coupled to said support platform for moving said support platform and the supported workpiece from the elevated position to the lowered position of said support platform to accommodate off-loading of the workpiece into the second environment and for moving said support platform from the lowered position to the elevated position to seal said opening in said receiving chamber and to segregate the second environment from said receiving chamber; and
   f) said receiving chamber including a purge gas inlet and outlet means for purging contaminants from said receiving chamber prior to movement of said support platform from the elevated position to the lowered position and further including means for preventing inflow into said receiving chamber of ambient atmosphere until said platform is returned to the elevated position.

2. A mechanism for loading a cassette containing a vertically spaced stack of substrates from an external environment into a processing system and for preventing contamination of the processing system by the external environment, said mechanism comprising:
   a) a receiving chamber having a hatch openable to the external environment for accommodating placement of the cassette into said receiving chamber;
   b) a feed chamber disposed below said receiving chamber said feed chamber including a feed port open to the processing system;
   c) a floor for separating said receiving chamber from said feed chamber, said floor including an opening formed therethrough;
   d) a movable cassette support platform having an elevated position for engaging said floor to hermetically seal said opening and a lowered position disposed within said feed chamber, said support platform including means for receiving the cassette upon locating said support platform in said receiving chamber;
   e) elevator means coupled to said support platform for moving said support platform and the cassette from the elevated position through each of a series of lowered positions to sequentially move each of the substrates stacked in the cassette one at a time into a predetermined position relative to said feed port to permit sequential off-loading of each of the substrates into the processing system and for moving said support platform and the supported cassette from the series of lowered positions to the elevated position upon completion of the off-loading of the substrates to seal said opening in said receiving chamber and to segregate the processing system from said receiving chamber; and f) said first housing including a purge gas inlet and a purge gas outlet for purging contaminants from said receiving chamber prior to movement of said support platform from the elevated position to the series of lowered positions and including further means for maintaining said receiving chamber sealed against intrusion of the external environment until said support platform is returned to the elevated position.

3. Apparatus for moving at least one workpiece from a first environment into a second environment and for preventing cross contamination between the first and second environments, said apparatus comprising:

a) a receiving chamber including an openable hatch for interconnecting said receiving chamber with the first environment and for accommodating passage of at least one workpiece from the first environment into said receiving chamber;

b) a feed chamber including a feed port for establishing communication between said feed chamber and the second environment;

c) means for segregating said receiving chamber from said feed chamber, said segregating means including an opening;

d) a positionable platform for receiving at least one workpiece, said platform having a first position to establish a hermetically sealed engagement with said opening to segregate and maintain segregated said receiving chamber from said feed chamber when said receiving chamber is contaminated by the first environment;

e) means for positioning said platform from the first position to a second position within said feed chamber to transport the at least one workpiece from said receiving chamber into the second environment within said feed chamber and to permit off loading of the at least one workpiece from said feed chamber through said feed port, said positioning means including means for returning said platform from the second position to the first position; and f) means for purging said receiving chamber of the first environment prior to positioning said platform from the first position to the second position, including means for maintaining said receiving chamber purged of the first environment until return of said platform into said receiving chamber.

4. The apparatus as set forth in claim 3 including a cassette for supporting a stack of spaced apart workpieces and wherein said platform includes means for supporting the cassette and wherein said positioning means includes means for incrementally positioning said platform to locate the cassette relative to said feed port to accommodate off loading from the cassette individual workpieces of the stack of workpieces.

5. The apparatus as set forth in claim 4 wherein said incremental positioning means includes means for serially locating said platform at each of a plurality of second positions to accommodate serial off loading of the workpieces from the cassette.

6. The apparatus as set forth in claim 5 including means for closing said hatch to seal said receiving chamber after placement of the cassette within said receiving chamber.

7. The apparatus as set forth in claim 3 including means for closing said hatch to seal said receiving chamber after placement of the at least one workpiece within said receiving chamber.

* * * * *